US012581811B2

(12) United States Patent
Zeng et al.

(10) Patent No.: US 12,581,811 B2
(45) Date of Patent: Mar. 17, 2026

(54) DISPLAY PANEL AND DISPLAY DEVICE

(71) Applicants: Hefei Visionox Technology Co., Ltd., Hefei (CN); KunShan Go-Visionox Opto-Electronics Co., Ltd., Kunshan (CN)

(72) Inventors: Wenyu Zeng, Hefei (CN); Xiuyu Zhang, Hefei (CN)

(73) Assignees: Hefei Visionox Technology Co., Ltd., Hefei (CN); KunShan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 18/654,288

(22) Filed: May 3, 2024

(65) Prior Publication Data

US 2024/0284726 A1     Aug. 22, 2024

(30) Foreign Application Priority Data

Sep. 20, 2023     (CN) .......................... 202311222756.6

(51) Int. Cl.
*H10K 59/126*          (2023.01)
*G06F 3/041*           (2006.01)
(Continued)

(52) U.S. Cl.
CPC ......... *H10K 59/126* (2023.02); *G06F 3/0412* (2013.01); *G06F 3/0446* (2019.05);
(Continued)

(58) Field of Classification Search
CPC ................. G06F 3/0412; G06F 3/0446; G06F 2203/04107; G06F 2203/04112;
(Continued)

(56) References Cited

U.S. PATENT DOCUMENTS

2017/0363899 A1*  12/2017  Nakayama ............... G06F 3/041
2024/0423057 A1*  12/2024  Peng .................... H10K 59/352
(Continued)

FOREIGN PATENT DOCUMENTS

CN        113471384  A        10/2021
CN        115167709            10/2022
(Continued)

OTHER PUBLICATIONS

Japanese Office Action with English translation, corresponding to Japanese Application No. 2024-135653, dated Aug. 18, 2024; 10 total pages.
(Continued)

*Primary Examiner* — Julie Anne Watko
(74) *Attorney, Agent, or Firm* — Kilpatrick Townsend & Stockton LLP

(57)     ABSTRACT

Disclosed are a display panel and a display device. The display panel includes a substrate, a display function layer, a touch structure, and a light-transmitting shielding layer located on the substrate. The display function layer includes a plurality of light-emitting devices and a plurality of light-transmitting openings, and the light-transmitting openings are arranged in a first area and located at interstices between the light-emitting devices. The touch structure is located on the display function layer and includes a touch electrode. The light-transmitting shielding layer is located between the touch structure and the substrate, and an orthographic projection of the light-transmitting opening on the substrate at least partially overlaps with an orthographic projection of the light-transmitting shielding layer on the substrate. The touch electrode and a circuit in the substrate are isolated by the light-transmitting shielding layer, thereby eliminating mutual interference between driving signals.

20 Claims, 16 Drawing Sheets

(51) Int. Cl.

| | |
|---|---|
| *G06F 3/044* | (2006.01) |
| *H10K 59/122* | (2023.01) |
| *H10K 59/40* | (2023.01) |
| *H10K 59/80* | (2023.01) |

(52) U.S. Cl.
CPC ........... *H10K 59/122* (2023.02); *H10K 59/40* (2023.02); *H10K 59/873* (2023.02); *G06F 2203/04107* (2013.01); *G06F 2203/04112* (2013.01)

(58) Field of Classification Search
CPC .... H10K 59/122; H10K 59/126; H10K 59/40; H10K 59/873
USPC ......................................................... 345/174
See application file for complete search history.

(56) References Cited

U.S. PATENT DOCUMENTS

| | | | | | |
|---|---|---|---|---|---|
| 2024/0427444 | A1* | 12/2024 | Shi | ........................ | G06F 3/0445 |
| 2025/0081828 | A1* | 3/2025 | Yao | ...................... | H10K 59/122 |
| 2025/0098492 | A1* | 3/2025 | Song | .................... | H10K 50/844 |

FOREIGN PATENT DOCUMENTS

| | | |
|---|---|---|
| JP | 2018181579 A | 11/2018 |
| JP | 2023071607 A | 5/2023 |
| KR | 1020230068546 A | 5/2023 |
| WO | WO-2024198432 A1 * | 10/2024 |

OTHER PUBLICATIONS

Korean Office Action for Korean Applicaion No. 10-2024-0108159 date Sep. 8, 2025.

* cited by examiner

DISPLAY PANEL AND DISPLAY DEVICE

CROSS-REFERENCE TO RELATED APPLICATION

This application claims priority to Chinese Patent Application No. 202311222756.6, filed on Sep. 20, 2023, which is hereby incorporated by reference in its entirety.

TECHNICAL FIELD

The present disclosure relates to the field of display technologies, and in particular, to a display panel and a display device.

BACKGROUND

An organic light-emitting diode (OLED) is an organic thin-film electroluminescent device. OLED has attracted great attention and is widely used in electronic display products due to advantages such as simple preparation process, low cost, low power consumption, high brightness, wide viewing angle, high contrast, an ability to achieve flexible display.

However, currently, electronic display products are limited by their own structural design, making it difficult to have both good touch and display functions when applied in scenarios such as under-screen recognition and transparent display.

SUMMARY

In a first aspect, the present disclosure provides a display panel, including: a substrate, and a display function layer, a touch structure, and a light-transmitting shielding layer located on the substrate. The display function layer includes a plurality of light-emitting devices and a plurality of light-transmitting openings arranged on the substrate, and the light-transmitting openings are arranged in a first area and located at interstices between adjacent two of the plurality of light-emitting devices. The touch structure is located on a side, away from the substrate, of the display function layer and includes a touch electrode. The light-transmitting shielding layer is located between the touch structure and the substrate, and an orthographic projection of the light-transmitting opening on the substrate at least partially overlaps with an orthographic projection of the light-transmitting shielding layer on the substrate.

According to the solution provided above, in an area where the plurality of light-transmitting openings are located, the touch electrode and a circuit in the substrate (for example, a circuit structure in a driving circuit layer mentioned below) are isolated by the light-transmitting shielding layer, thereby eliminating mutual interference between driving signals driving the circuit in the substrate and the touch electrode respectively.

In a second aspect, the present disclosure provides a display device, and the display device may include the display panel provided in any one of the above embodiments.

DETAILED DESCRIPTION OF THE EMBODIMENTS

Figure 1:
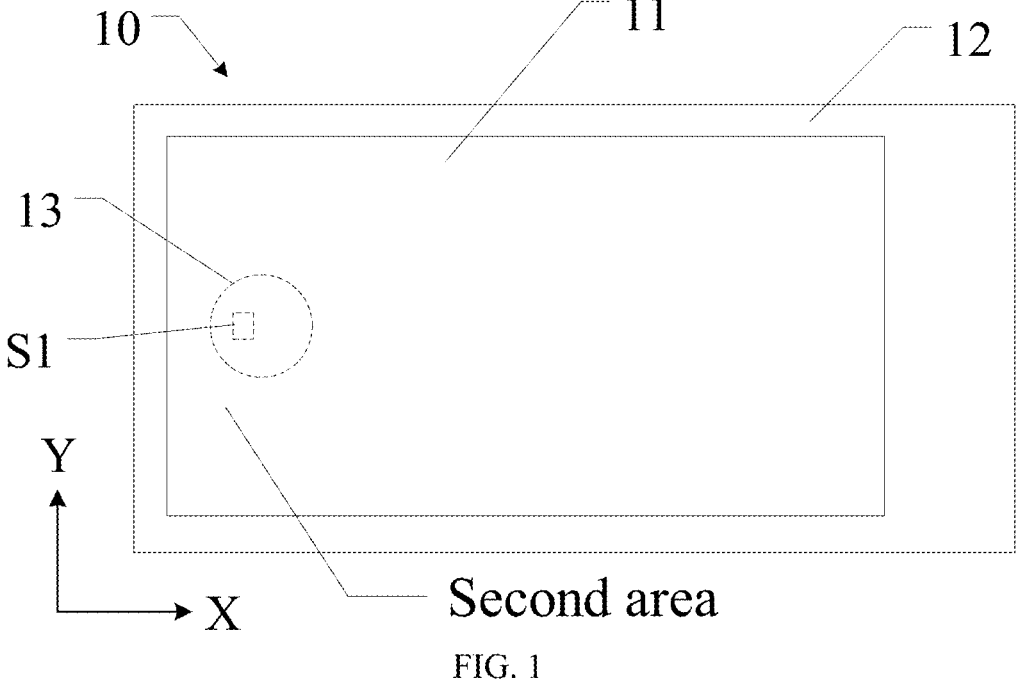
FIG. 1 is a schematic diagram of a planar structure of a display panel according to an embodiment of the present disclosure, and shows a display substrate of the display panel.
Figure 2:
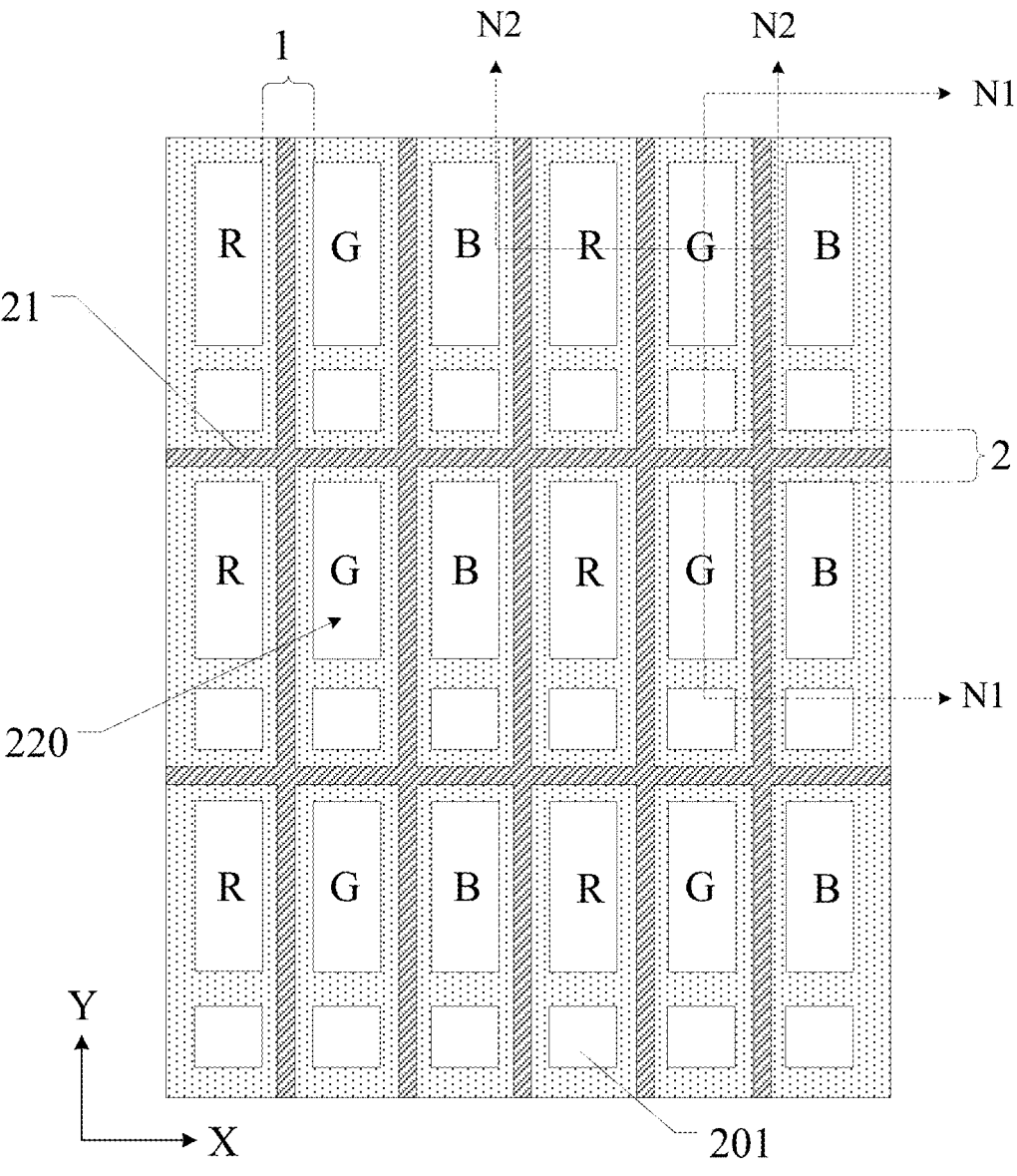
FIG. 2 is an enlarged view of an area S1 of the display panel shown in FIG. 1 in a design.

Technical solutions in embodiments of the present disclosure will be clearly and completely described with reference to accompanying drawings corresponding to the embodiments of the present disclosure in the following description. Apparently, the described embodiments are only some, not all, embodiments of the present disclosure. Based on the embodiments in the present disclosure, all other embodiments obtained by those skilled in the art without creative efforts shall fall within the protection scope of the present disclosure.

A display panel may balance transparent display, under-screen recognition (fingerprint recognition, under-screen shooting), and touch functions simultaneously. A light-transmitting area of the display panel may be divided, and light-transmitting holes are placed at interstices of sub-pixels in the light-transmitting area to achieve transparency. However, in an area where the light-transmitting holes are located, there might be signal interference between a conductive structure used for touch function (e.g., the touch electrodes mentioned below) and a lower-level driving circuit (e.g., a driving circuit in the substrate mentioned below), potentially leading to malfunction of touch or display functions.

At least one embodiment of the present disclosure provides a display panel and a display device to at least solve the technical problem mentioned above. The display panel includes a display area, the display area includes a first area, and the display panel includes a substrate and a display function layer, a touch structure, and a light-transmitting shielding layer located on the substrate. The display function layer includes a plurality of light-emitting devices and a plurality of light-transmitting openings arranged on the substrate, and the light-transmitting openings are arranged in the first area and located at interstices between the light-emitting devices. The touch structure is located on a side, away from the substrate, of the display function layer and includes a touch electrode. The light-transmitting shielding layer is located between the touch structure and the substrate, and an orthographic projection of the light-transmitting opening on the substrate at least partially overlaps with an orthographic projection of the light-transmitting shielding layer on the substrate. In the display panel, in an area where the light-transmitting openings are located, the touch electrode and a circuit in the substrate are isolated by the light-transmitting shielding layer, thereby eliminating mutual interference between driving signals of a circuit of the substrate and the touch electrode.

A structure of the display panel in at least one embodiment of the present disclosure will be described in detail below with reference to the accompanying drawings. In addition, in these accompanying drawings, a spatial rectangular coordinate system is established with the substrate (or display substrate) in the display panel as the reference, to visually present a positional relationship of various elements in the display panel. In the rectangular coordinate system, an X-axis and a Y-axis are parallel to a plane of the substrate, and a Z-axis is perpendicular to the plane of the substrate.

As shown in FIGS. 1 to 4, a display panel 10 includes a display area 11 and a non-display area 12 surrounding the display area 11. The display area 11 includes a first area 13, where sub-pixels emitting different colored light such as red (R), green (G), and blue (B). A light-transmitting opening 201 is provided in the first area 13, allowing the first area 13 to have a certain transmittance for applications like under-screen recognition, imaging, or transparent display. In some embodiments of the present disclosure, some of wiring in the non-display area 12 may be arranged to extend into the display area 11, so that the non-display area 12 may be designed as a single-sided border.

A physical structure of the display panel 10 includes a substrate 100, and layers such as a display function layer 200, a touch structure 20, and a light-transmitting shielding layer 30 that are provided on the substrate 100.

In the embodiment of the present disclosure, a circuit structure is integrated in the substrate for driving function structures used to achieve display or other functions (e.g., fingerprint recognition). The function structures may be designed based on a specific application requirement of the display panel in an actual production, and are not limited herein. Accordingly, a specific design and type of the circuit structure in the substrate is not limited. For example, in at least one embodiment of the present disclosure, the substrate 100 may include a base and s driving circuit layer located on the base, with a plurality of pixel driving circuits located in the display area 11, and the display function layer 200 is located on the driving circuit layer. For example, the pixel driving circuit may include a plurality of thin film transistors (TFT), capacitors, and the like, for example, formed in various configurations such as 2T1C (two TFTs and one C), 3T1C, or 7T1C. The pixel driving circuit is connected to a light-emitting device 220 to control an on-off state and the light-emitting brightness of the light-emitting device 220.

For example, the display functional layer 200 includes a plurality of light-emitting devices 220 and a plurality of light-transmitting openings 201 arranged on the substrate 100, and the light-transmitting opening 201 is arranged in the first area 13 and located at an interstice between the light-emitting devices 220. The light-emitting device 220 is a physical light-emitting structure of the sub-pixels R, G and B, that is, the light-transmitting opening 201 is provided at the interstice between the light-emitting devices 220 for light transmission.

For example, the touch structure 20 is located on a side, away from the substrate 100, of the display function layer 200 and includes a touch electrode 400.

For example, the light-transmitting shielding layer 30 is located between the touch structure 20 and the substrate 100, and an orthographic projection of the light-transmitting opening 201 on the substrate 100 at least partially overlaps with an orthographic projection of the light-transmitting shielding layer 30 on the substrate 100.

For example, a material of the light-transmitting shielding layer 30 is a transparent conductive material. For example, the transparent conductive material may be any one of indium tin oxide (ITO), indium gallium oxide (IGO), indium zinc oxide (IZO), and the like.

Figure 3:
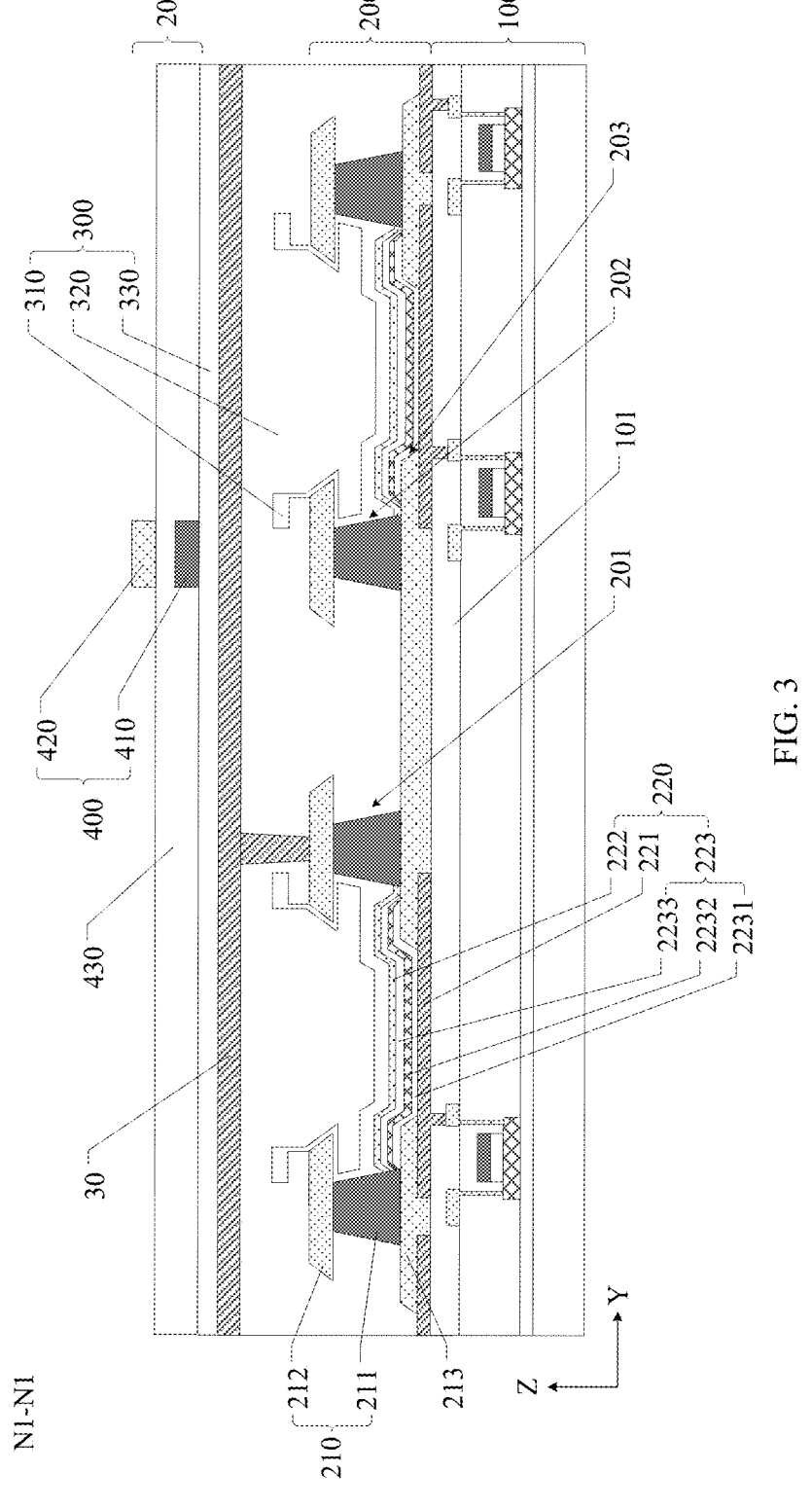
FIG. 3 is a cross-sectional view of the display panel shown in FIG. 2 along N1-N1 in a design.

In at least one embodiment of the present disclosure, as shown in FIG. 3, the orthographic projection of the light-transmitting opening 201 on the substrate 100 is within the orthographic projection of the light-transmitting shielding layer 30 on the substrate 100, so that the shielding effect of the light-transmitting shielding layer 30 on the driving signals between the touch electrode 400 and the driving circuit layer may be further improved.

In at least one embodiment of the present disclosure, referring back to FIG. 2 and FIG. 3, the interstice between adjacent light-emitting devices 220 (for example, sub-pixel R and sub-pixel G) is referred to as a first interstice 1, an interstice between the light-emitting device 220 and the light-transmitting opening 201 adjacent to the light-emitting device 220 is referred to as a second interstice 2. The touch electrode 400 may be designed as a grid-like electrode, and orthographic projections of grid lines of the grid-like electrode on the substrate 100 are located within orthographic projections of the first interstice 1 and the second interstice 2 on the substrate 100. That is, orthographic projections of a part of the grid lines 21 of the touch electrode 400 on the substrate 100 are located within orthographic projections of interstices between the sub-pixels, and orthographic projections of the other part of the grid lines 21 of the touch electrode 400 on the substrate 100 are located within orthographic projections of interstices between the sub-pixels and the light-transmitting openings 201 on the substrate 100. According to this design, light transmittance of the touch electrode 400 may be increased, so that a material of the touch electrode 400 may be a high-conductivity material such as metal.

Figure 4:
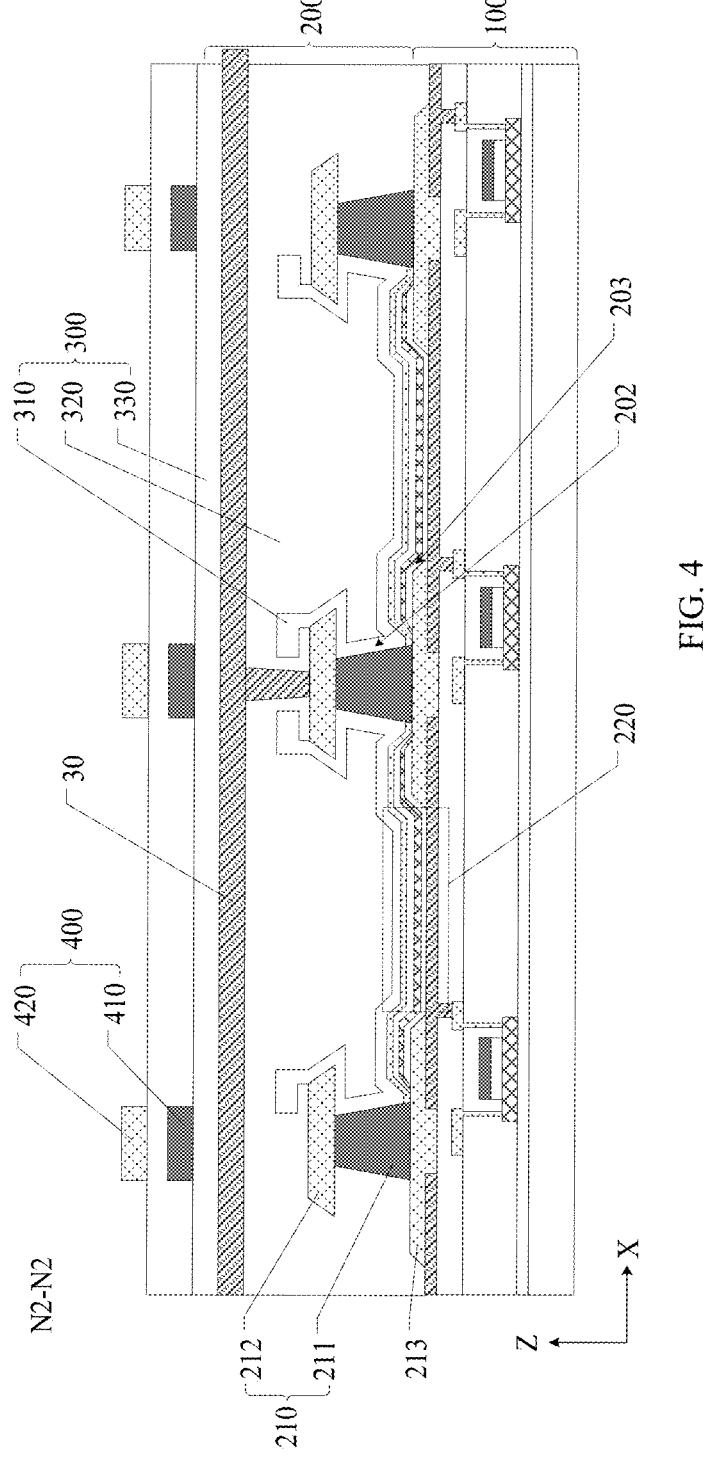
FIG. 4 is a cross-sectional view of the display panel shown in FIG. 2 along N2-N2.

In at least one embodiment of the present disclosure, as shown in FIG. 3 and FIG. 4, the display panel may further include an isolation structure 210, the isolation structure 210 is located on the substrate 100 and defines the plurality of light-transmitting openings 201 and a plurality of isolation openings 202, and the light-emitting devices 220 are respectively limited in the plurality of isolation openings 202. Thus, due to application of the isolation structure 210, a mask plate may not be required during a preparation process of the light-emitting device 220. Therefore, there is no need to consider a problem of alignment accuracy during the preparation process, thereby facilitating reducing an interstice size of the light-emitting device 220 and improving pixel-per-inch (PPI) of the display panel 10 (of which a principle may be seen in relevant descriptions of embodiments shown in FIG. 12A to FIG. 12E). In addition, in the first area 13, the plurality of light-transmitting openings 201 are provided in the isolation structure 210, so that an area of the display panel 10 provided with the light-transmitting openings 201 is transparent, enabling the first area 13 of the display panel 10 to achieve transparent display or under-screen recognition functions such as fingerprint recognition and under-screen camera and the like.

The light-transmitting shielding layer 30 only needs to cover the first area 13 and isolate the driving circuit layer and the touch electrode 400. Under this premise, a specific position of the light-transmitting shielding layer 30 is not further limited. Specific configurations of structures such as the isolation structure 210, the touch electrode 400 and the light-emitting device 220 in the display panel will be briefly described below to describe several specific configurations of the light-transmitting shielding layer 30.

For example, the light-emitting device 220 includes a first electrode 221, a light-emitting function layer 223, and a second electrode 222 sequentially stacked on the substrate 100. For example, the first electrode 221 may be an anode, and the second electrode 222 may be a cathode.

For example, the light-emitting function layer 223 may include a first common layer 2231, a light-emitting layer 2232, and a second common layer 2233. The first common layer 2231, the light-emitting layer 2232, and the second common layer 2233 are sequentially stacked on the first electrode 221. The first common layer 2231 may include a hole injection layer, a hole transport layer, an electron blocking layer, and the like. The second common layer 2232 may include an electron injection layer, an electron transport layer, a hole blocking layer, and the like. Configuration of the isolation structure 210 needs to enable the first common layer 2231 (a main film layer causing current crosstalk) of each light-emitting device 220 to be electrically disconnected from each other.

For example, the isolation structure 210 includes a support portion 211 and a crown portion 212 sequentially stacked on the substrate 100. An orthographic projection of the support portion 211 on the substrate 100 is within an orthographic projection of the crown portion 212 on the substrate 100, and the support portion 211 is a conductive structure. The light-emitting function layer 223 and the second electrode 222 of the light-emitting device 220 are located in an isolation opening 202 corresponding to the light-emitting device 220. The second electrode 222 of the light-emitting device 220 is located in the corresponding isolation opening 202 and is connected to the support portion 211. In this way, at the interstice between adjacent light-emitting devices 220, the isolation structure 210 appears to be wide on the top and narrow at the bottom. In this way, in the preparation process of the light-emitting device 220, isolation effect of the isolation structure 210 to the light-emitting function layer 223 (e.g., the first common layer 2231 included in the isolation structure 220 is a main film layer causing current crosstalk) may be increased, so as to reduce a problem of current crosstalk between adjacent light-emitting devices 220.

A material of the second electrode 222 may be a metal material. The thinner the thickness of the second electrode 222 is, the higher the light transmittance will be, but also the higher the resistivity of the second electrode 222 will be. If the thickness of the second electrode 222 is too small and the isolation structure 210 is not provided, it will lead to a significant voltage drop across the second electrode 222 (which is now a common electrode). In the embodiment of the present disclosure, the second electrode 222 is connected to the conductive support portion 211, so that a thickness limitation of the second electrode 222 is removed, allowing the second electrode 222 to have a smaller thickness and higher transmittance.

In at least one embodiment of the present disclosure, the support portion 211 may be of a metal conductive structure. A metal material has a high conductivity, so that a voltage drop may be reduced when a cathode is driven. Consequently, metal materials can only be transparent when thickness is extremely thin (e.g., on the order of tens of nanometers). The isolation structure 220 needs a certain thickness to block the light-emitting function layer 223 (which includes the first common layer 2231 included in the isolation structure 220). As a result, the support portion 211 of the isolation structure 220 is almost opaque. Therefore, only by setting the transparent openings 201 can the isolation structure 210 be made transparent.

In at least one embodiment of the present disclosure, referring back to FIG. 3 and FIG. 4, the display function layer 223 may further include a pixel defining layer 213, located on a side, close to the isolation structure 210, of the substrate 100, that is, located between the substrate 100 and the isolation structure 210. And the pixel defining layer 213 includes a plurality of pixel openings 203 respectively corresponding to the plurality of isolation openings 202. The pixel opening 203 limits the light-emitting device 220 and exposes the first electrode 221. The plurality of pixel openings 203 respectively correspond to the plurality of isolation openings 202, and the plurality of pixel openings 203 are connected to the plurality of isolation openings 202 correspondingly.

In the embodiment of the present disclosure, a specific structure of the touch electrode is not limited, design of the touch electrode may be performed based on a requirement of an actual process. Different designs of the touch electrode are described below through different embodiments, specifically as follows.

Figure 5A:
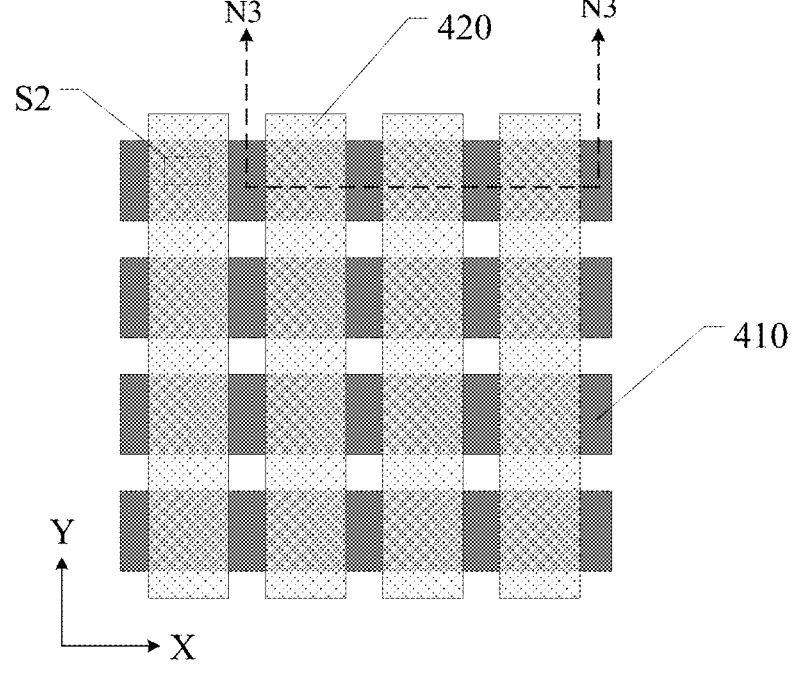
FIG. 5A is a schematic diagram of a planar structure of a touch electrode in a display panel according to an embodiment of the present disclosure, and an area S2 in FIG. 5 corresponds to the area S1 in FIG. 1.
Figure 5B:
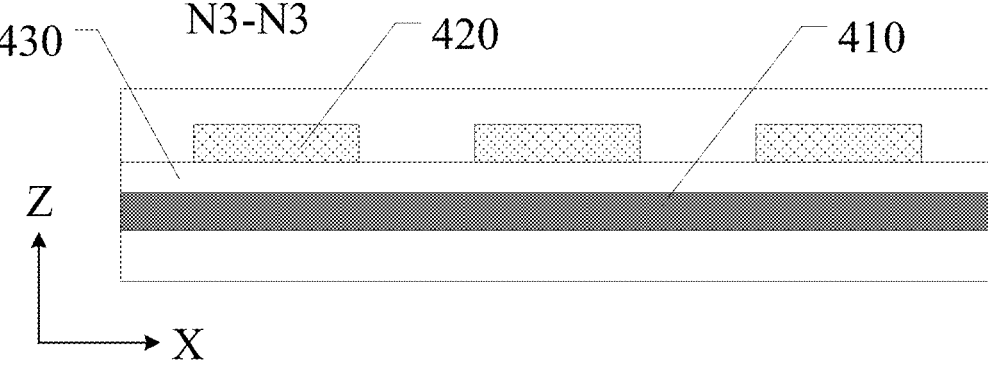
FIG. 5B is a cross-sectional view of the touch electrode shown in FIG. 5A along N3-N3.

In at least one embodiment of the present disclosure, as shown in FIG. 5A and FIG. 5B, the touch electrode 400 includes a plurality of first electrode strips 410 arranged in parallel and a plurality of second electrode strips 420 arranged in parallel. The first electrode strip 410 and the second electrode strip 420 are spaced apart from each other and intersect with each other to form a touch unit at an intersection, and the plurality of first electrode strips 410 and the plurality of second electrode strips 420 are arranged to be a grid-like electrode.

For example, in some embodiments of the present disclosure, as shown in FIG. 5A and FIG. 5B, the first electrode strip 410 is located between the second electrode strip 420 and the isolation structure 210. Macroscopically, an area where the first electrode strip 410 and the second electrode strip 420 intersect and overlap with each other is an area where the touch unit is located, and in the overlapping area, both the first electrode strip 410 and the second electrode strip 420 are transparent. The first electrode strip 410 and the second electrode strip 420 may be isolated by an insulating layer 430.

Figure 6A:
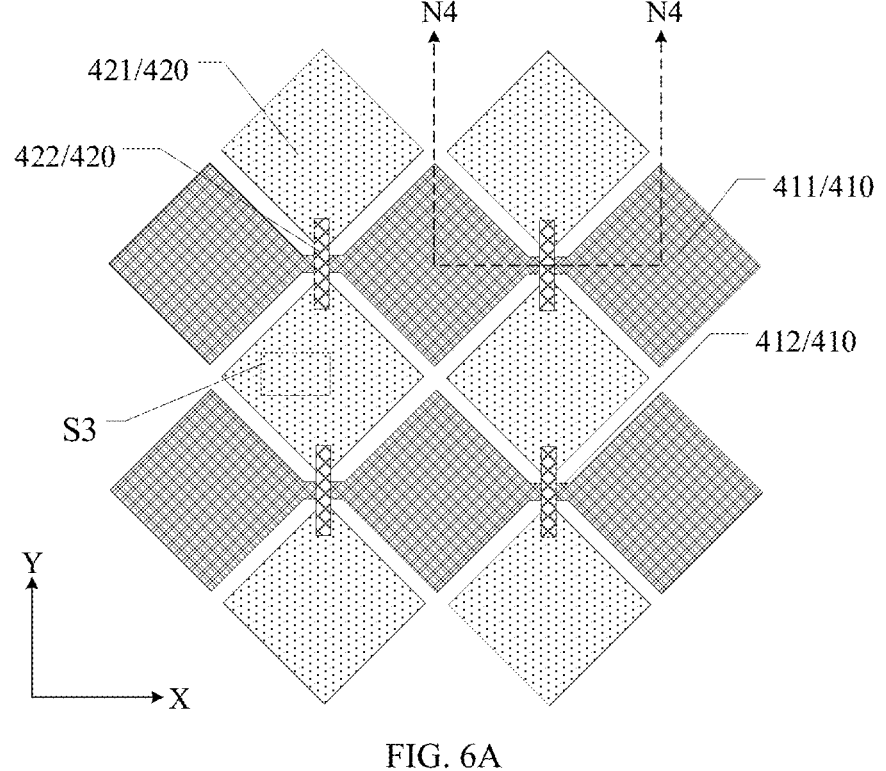
FIG. 6A is a schematic diagram of a planar structure of a touch electrode in a display panel according to an emb odiment of the present disclosure, and an area S3 in FIG. 5 corresponds to the area S1 in FIG. 1.
Figure 6B:
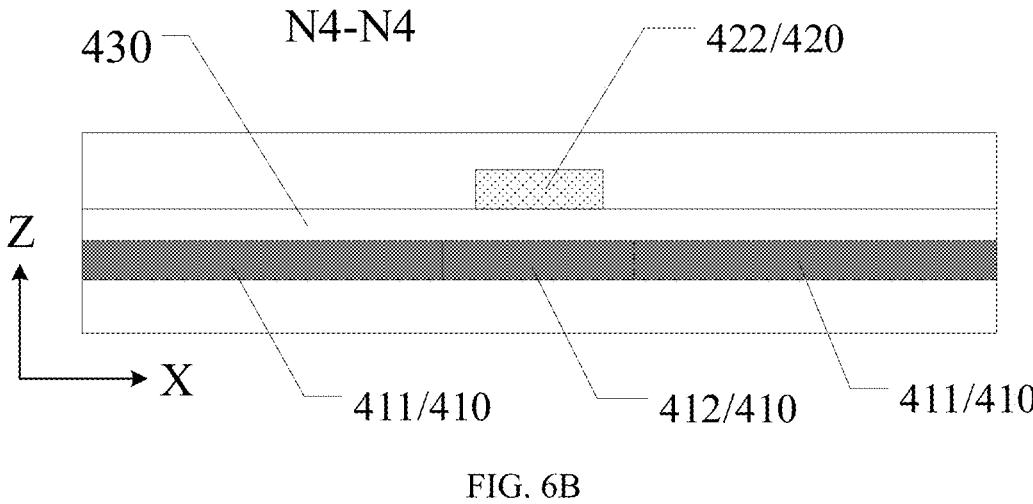
FIG. 6B is a cross-sectional view of the touch electrode shown in FIG. 6A along N4-N4.

For example, in some other embodiments of the present disclosure, as shown in FIG. 6A and FIG. 6B, the first electrode strip 410 includes a plurality of first electrode blocks 411 spaced apart and a plurality of first connecting portions 412, and the plurality of first electrode blocks 411 of the same first electrode strip 410 are connected by the plurality of first connecting portion 412. The second electrode strip 420 includes a plurality of second electrode blocks 421 spaced apart and a plurality of second connecting portions 422, and the plurality of second electrode blocks 421 of the same second electrode strip 420 are connected by the plurality of second connecting portion 422. The first connecting portion 412 and the second connecting portion 422 intersect and are spaced apart from each other. The first electrode block 411, the first connecting portion 412, and the second electrode strip 420 are in the same layer, and the second connecting portion 422 is located between the first connecting portion 412 and the isolation structure 210, or the second connecting portion 422 is located on a side, away from the isolation structure 210, of the first connecting portion 412. In this design, the touch electrode 400 has a high light transmittance, and alignment accuracy between a mesh hole and the light-transmitting opening 201 and the isolation opening 202 is high, so that the light transmittance of the first area 13 may be improved. In this design, main body parts of the first electrode strip 410 and the second electrode strip 420 are on the same layer, eliminating the need to consider alignment issues between the mesh holes of the first electrode strips 410 and the second electrode strips 420, which is beneficial for improving the transmittance of the touch electrode 400. For example, the second connecting portion 422 and the first connecting portion 412 may be isolated by an insulating layer 430.

In at least one embodiment of the present disclosure, referring back to FIG. 3 and FIG. 4, an encapsulation layer 300 may be provided between the display function layer 200 and the touch structure 20. For example, the encapsulation layer 300 may include a first encapsulation layer 310, a second encapsulation layer 320, and a third encapsulation layer 330 sequentially stacked on the display function layer 200, and the second encapsulation layer 320 is located between the first encapsulation layer 310 and the third encapsulation layer 330. The first encapsulation layer 310 and the third encapsulation layer 330 are inorganic layers with high density to isolate water and oxygen, while the second encapsulation layer 320 is an organic layer with a greater thickness to flatten a surface of the display panel, facilitating preparation of the touch electrode 400 on the encapsulation layer 30.

The first encapsulation layer 310 may be configured to protect the light-emitting device 220 during the preparation process of the light-emitting device 220, that is, during the preparation process of the light-emitting device 220, the first encapsulation layer 310 may be synchronously formed. For specific details, please refer to relevant explanations in the embodiments shown in FIGS. 12A to 12E below, which is not elaborated here.

The following describes several configurations of the light-transmitting shielding layer.

Figure 7:
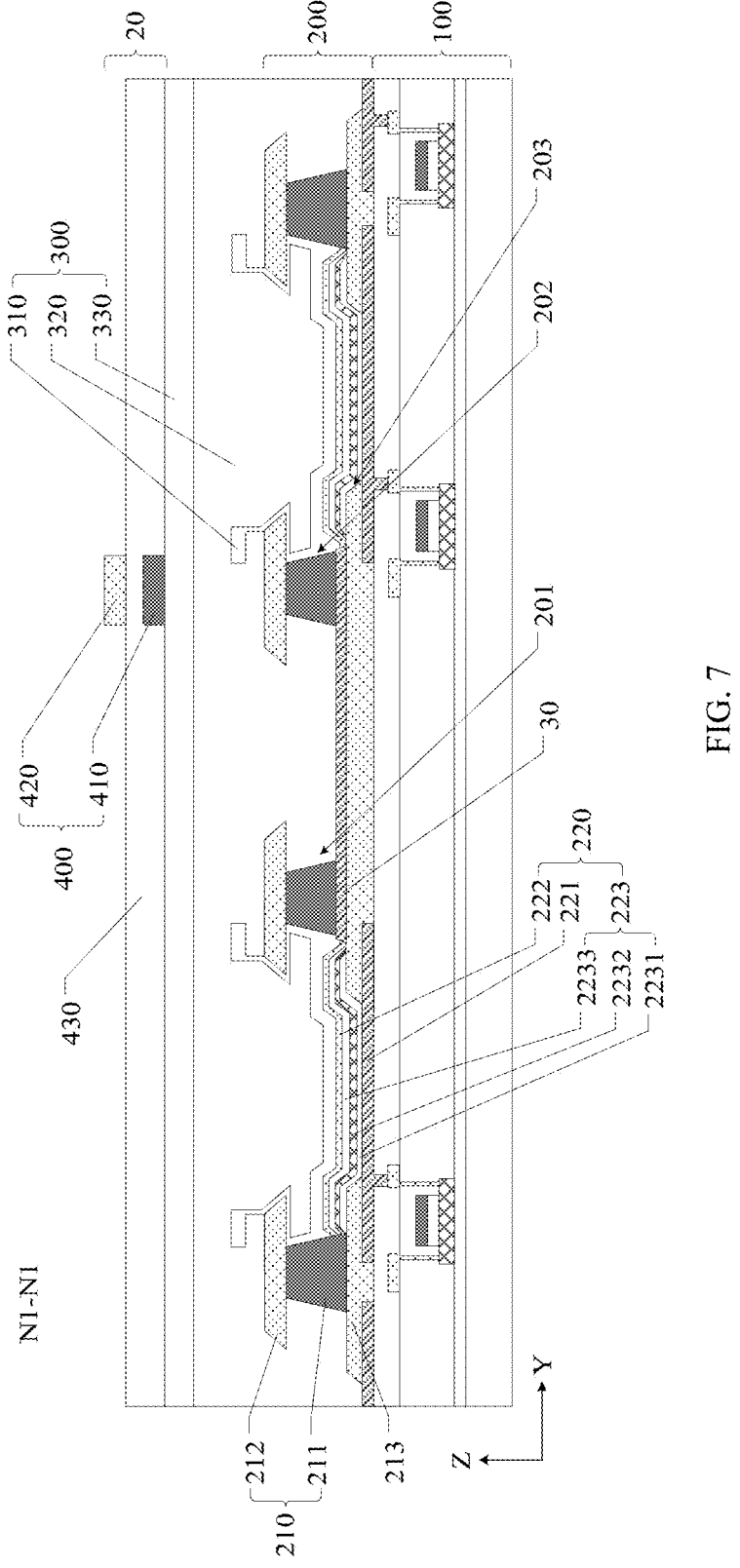
FIG. 7 is a cross-sectional view of the display panel shown in FIG. 2 along N1-N1 in another design.

In some embodiments of the present disclosure, as shown in FIG. 7, the light-transmitting shielding layer 30 is located on a side, close to the isolation structure 210, of the pixel defining layer 213, that is, located between the pixel defining layer 213 and the isolation structure 210, and is connected to the support portion 211. For example, in this design, the light-transmitting shielding layer 30 may also be configured as a grid, and mesh holes of the light-transmitting shielding layer 30 correspond to the plurality of isolation openings 202 respectively.

Figure 8:
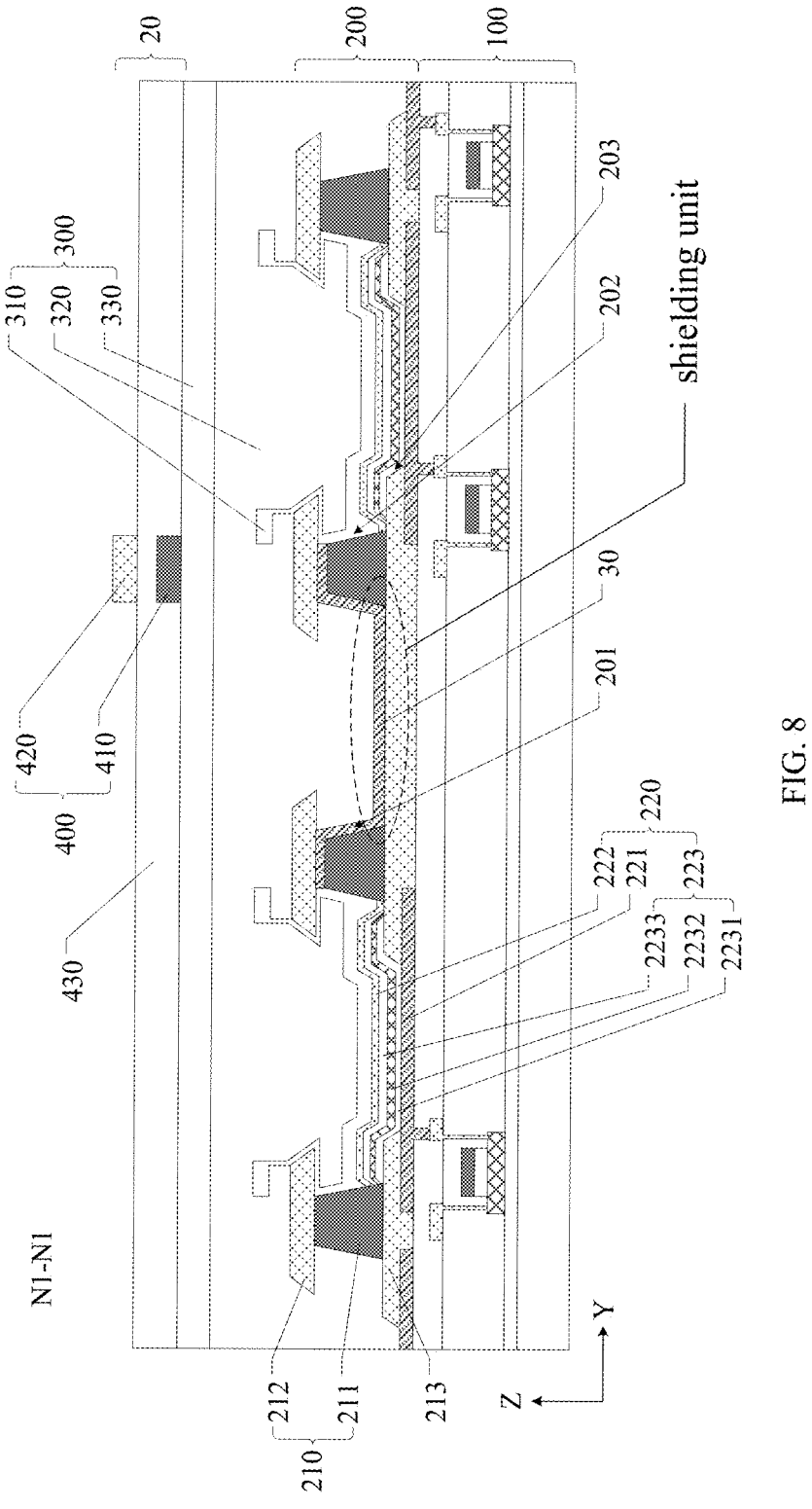
FIG. 8 is a cross-sectional view of the display panel shown in FIG. 2 along N1-N1 in another design.

In some other embodiments of the present disclosure, as shown in FIG. 8, the light-transmitting shielding layer 30 is located on a side, close to the crown portion 212, of the support portion 211, that is, located between the support portion 211 and the crown portion 212, and is connected to the support portion 211. In other words, the light-transmitting shielding layer 30 is located inside the isolation structure 210. For example, furthermore, the orthographic projection of the light-transmitting shielding layer 30 on the substrate 100 overlaps with the orthographic projection of the support portion 211 on the substrate 100, that is, the light-transmitting shielding layer 30 may also be configured as a grid, and the mesh holes of the light-transmitting shielding layer 30 correspond to the plurality of isolation openings 202 respectively. In this design, the crown portion 212 is not limited to be a conductive structure, thereby removing material constraints on the crown portion 212, allowing the crown portion 212 to have a larger size to improve the isolation effect on the light-emitting functional layer 223.

In some other embodiments of the present disclosure, the light-transmitting shielding layer includes a plurality of shielding units located in the plurality of light-transmitting openings and covering at least a part of a side wall of the supporting portion. For example, the light-transmitting shielding layer 30 shown in FIG. 8 may be modified such that only a part located in the light-transmitting opening 201 is retained, which is equivalent to the shielding unit.

Figure 9:
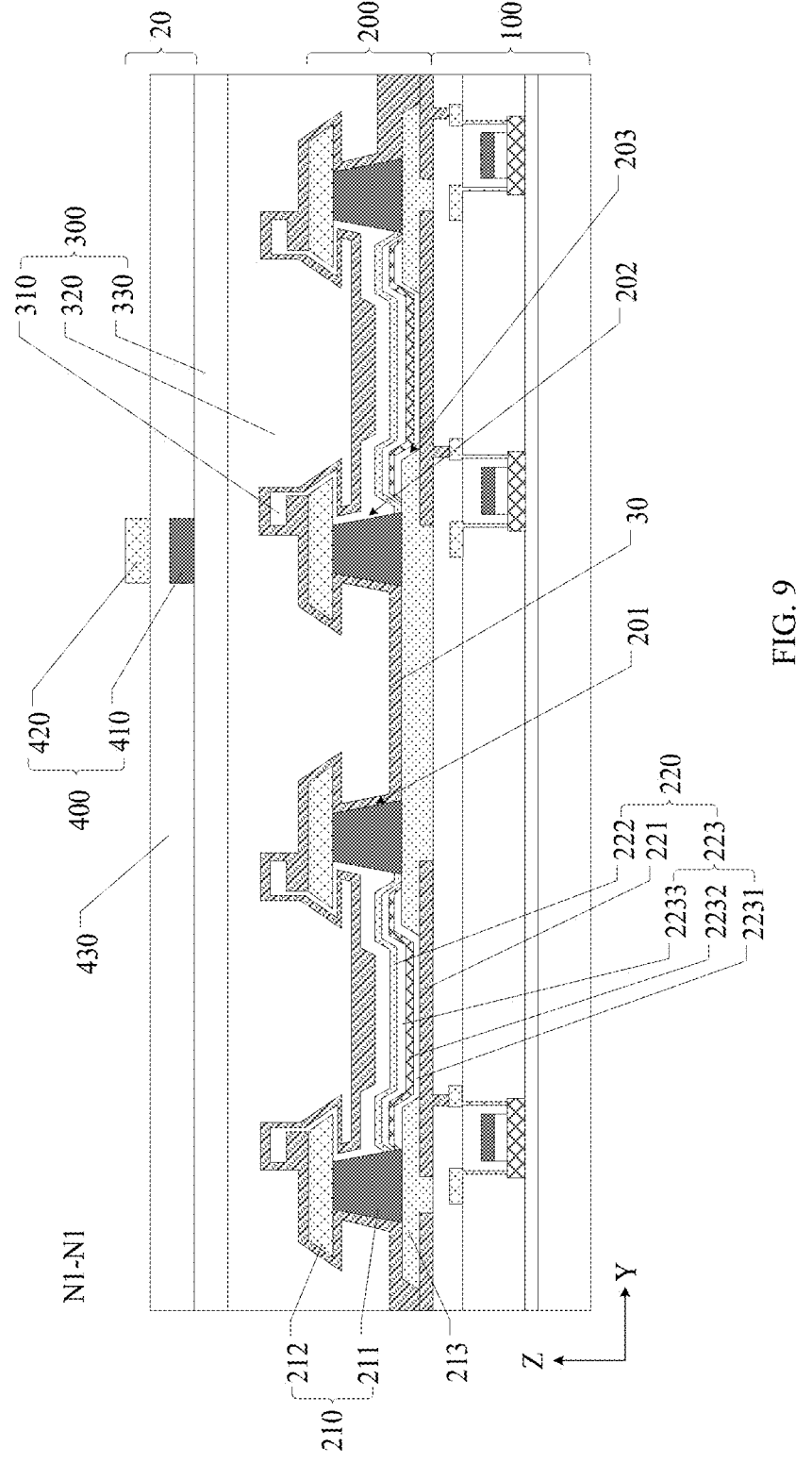
FIG. 9 is a cross-sectional view of the display panel shown in FIG. 2 along N1-N1 in another design.

In some other embodiments of the present disclosure, as shown in FIG. 9, the light-transmitting shielding layer 30 covers the display area 11, and is located on a side, away from the substrate 100, of the isolation structure 210 and in contact with a surface, away from the substrate 100, of the isolation structure 210. The crown portion 212 is a conductive structure.

In some other embodiments of the present disclosure, as shown in FIG. 9, the light-transmitting shielding layer 30 covers the display area 11, and is located between the first encapsulation layer 310 and the second encapsulation layer 320. The light-transmitting shielding layer 30 is in contact with the isolation structure 210, and the isolation structure 210 is a conductive structure.

In some other embodiments of the present disclosure, referring back to FIG. 3 and FIG. 4, the light-transmitting shielding layer 30 covers the display area 11, and is located between the second encapsulation layer 320 and the third encapsulation layer 330. A through hole is provided in the second encapsulation layer 320. The light-transmitting shielding layer 30 is connected to the isolation structure 210 through the through hole, and the isolation structure 210 is a conductive structure.

Figure 10:
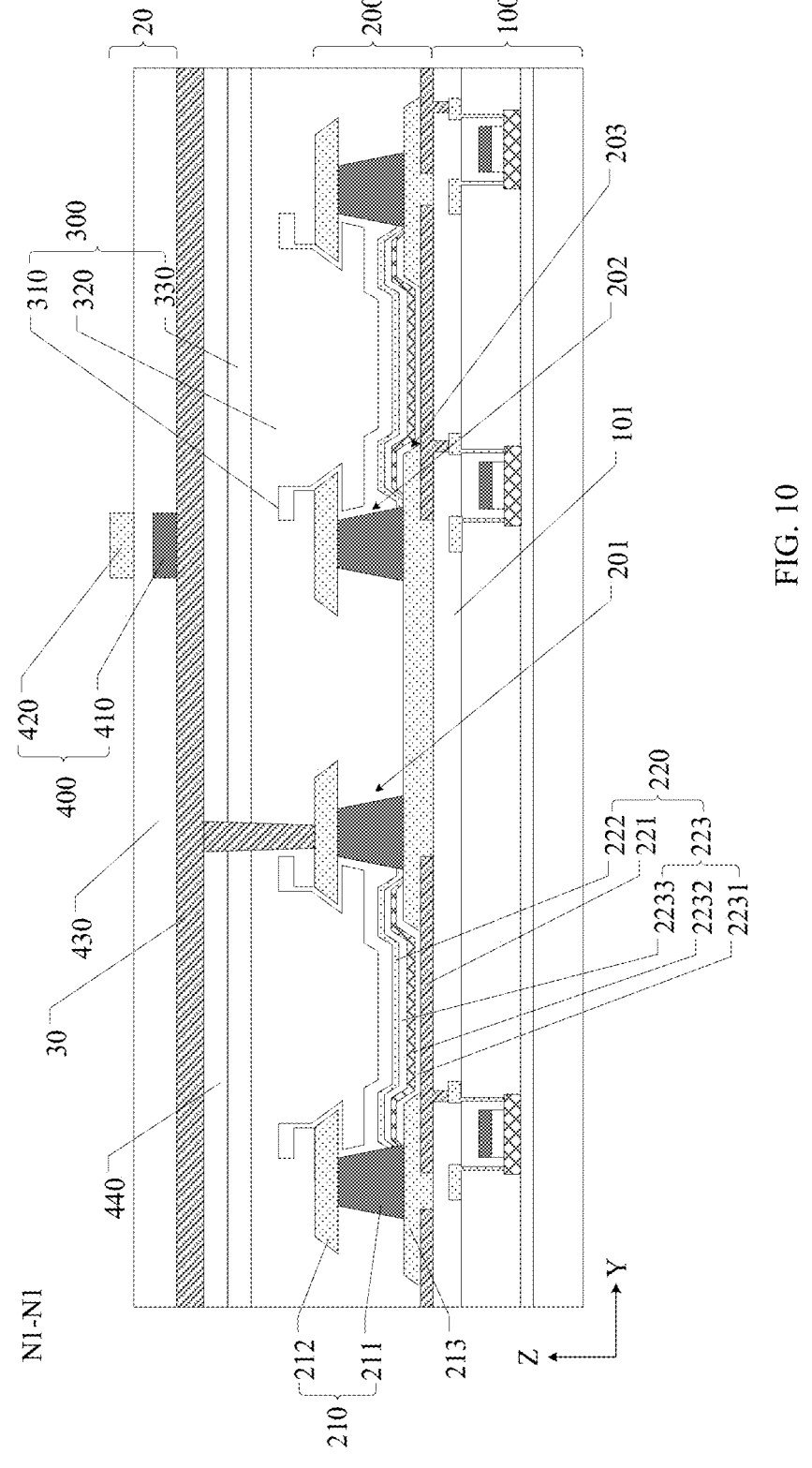
FIG. 10 is a cross-sectional view of the display panel shown in FIG. 2 along N1-N1 in another design.

In some other embodiments of the present disclosure, as shown in FIG. 10, a buffer layer 440 may be disposed between the encapsulation layer 300 and the touch structure 20, so as to avoid damage to the encapsulation layer 300 caused by preparation of the touch electrode 400. For example, furthermore, the light-transmitting shielding layer 30 covers the display area 11, and the light-transmitting shielding layer 30 is located between the buffer layer 440 and the touch structure 20. Through holes are formed in the second encapsulation layer 320 and the buffer layer 440, the light-transmitting shielding layer 30 is connected to the isolation structure 210 through the through holes, and the isolation structure 210 is a conductive structure.

The through hole may be located in the display area or outside the display area, that is, the light-transmitting shielding layer 30 and the isolation structure 210 may be connected in the display area. Alternatively, the light-transmitting shielding layer 30 and the isolation structure 210 may be connected in a non-display area outside the display area. In this case, both the light-transmitting shielding layer 30 and the isolation structure 210 extend into the non-display area. In the non-display area, gentle slopes will be formed at the edges of the second encapsulation layer 320 and the third encapsulation layer 330 to facilitate arrangement of a signal line, and a part of the light-transmitting shielding layer 30 located in this area may be designed as a signal line to extend from the gentle slope to the non-display area to be connected to the isolation structure 210.

Figure 11:
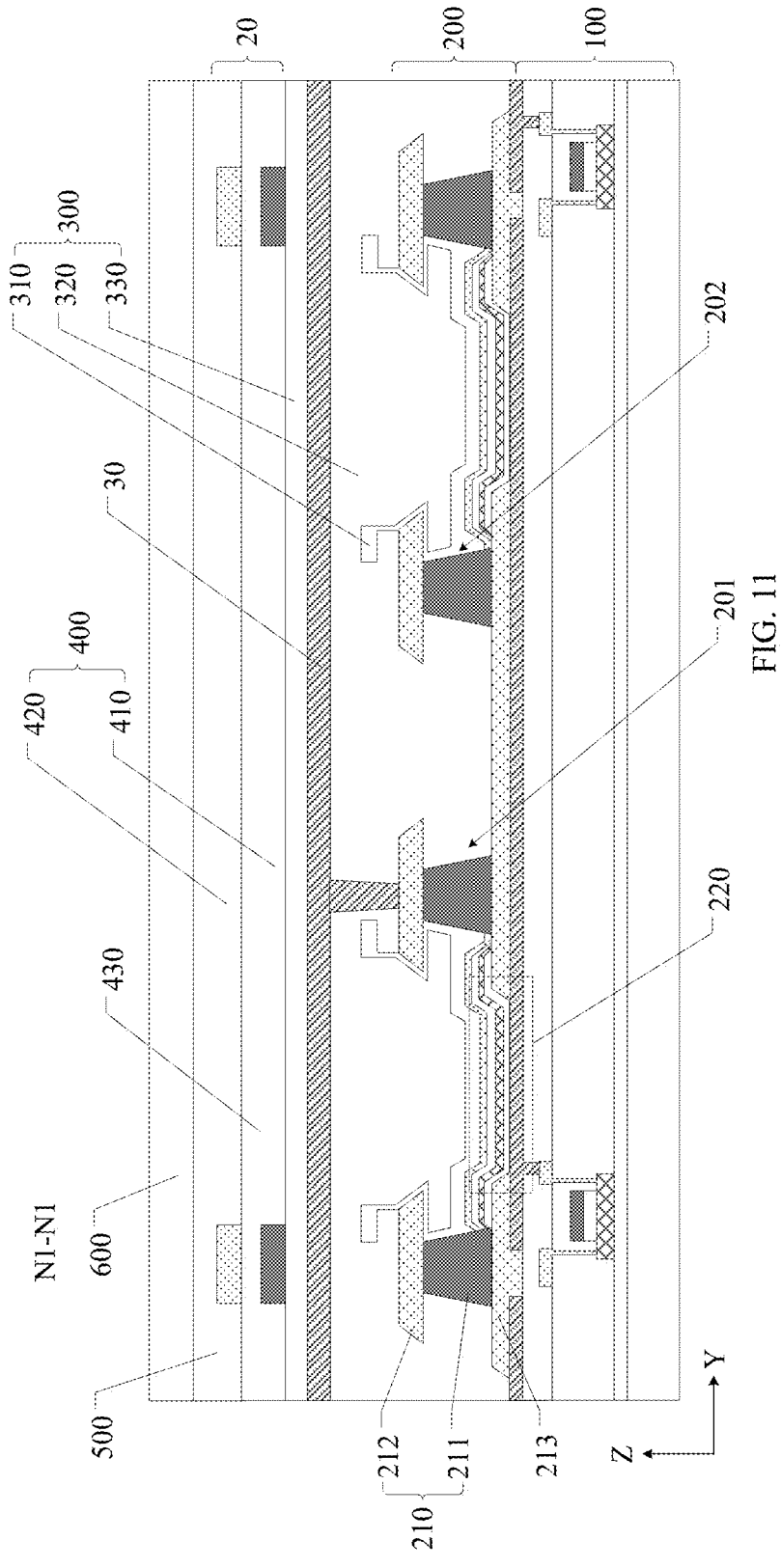
FIG. 11 is a cross-sectional view of the display panel shown in FIG. 2 along N1-N1 in another design.

For example, as shown in FIG. 11, the display panel may further include structures such as an optical film 500, a cover plate 600. The structures may be located on a side, away from the display function layer 200, of the touch structure 20.

In the following, a preparation process of the display panel shown in FIG. 3 will be described with reference to FIGS. 12A to 12E, to demonstrate how the isolation structure can increase the pixel-per-inch (PPI).

Figure 12A:
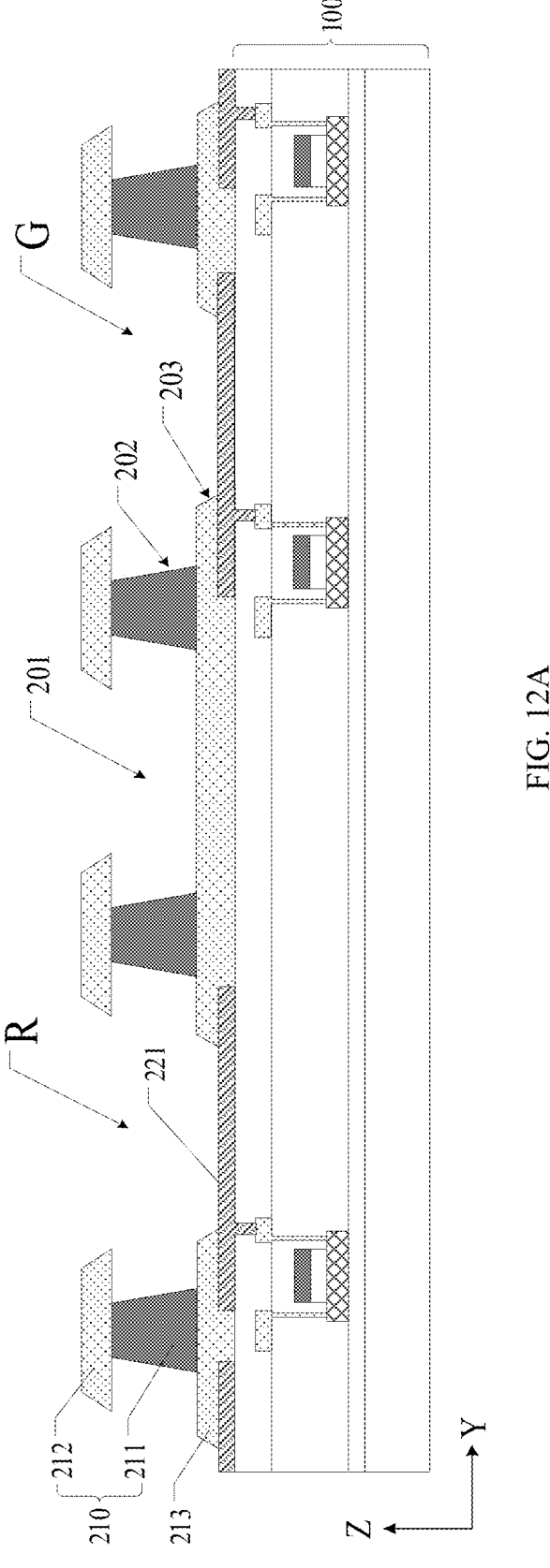
FIG. 12A to FIG. 12E are process diagrams of a method for preparing a display panel according to an embodiment of the present disclosure.

As shown in FIG. 12A, a substrate 100 is provided and a first electrode 221 arranged in an array is formed on the substrate 100. An insulating material film layer (for example, an inorganic material film layer) is deposited on the substrate 100 on which the first electrode has been formed. A support portion 211 and a crown portion 212 are formed on the display panel, where a plurality of light-transmitting opening 201 and a plurality of isolation opening 202 are formed. A patterning process is performed on the insulating material film layer to form a pixel defining layer 213 (with a grid-like planar shape), and the pixel defining layer 213 includes a plurality of pixel openings 203 and covers interstices between adjacent first electrodes. There-fore, a planar shape of the pixel defining layer 213 is grid-like.

In the embodiments of the present disclosure, the pattern-ing process may be a photolithography patterning process. For example, the process may include: coating photoresist on a structure layer to be patterned, exposing the photoresist by using a mask plate, developing exposed photoresist to obtain a photoresist pattern, etching the structure layer by using the photoresist pattern (either wet etching or dry etching may be used), and optionally removing the photo-resist pattern. In a case that a material of the structure layer (for example, photoresist pattern 700 mentioned below) includes the photoresist, the structure layer may be directly exposed through the mask plate to form a desired pattern.

Figure 12B:
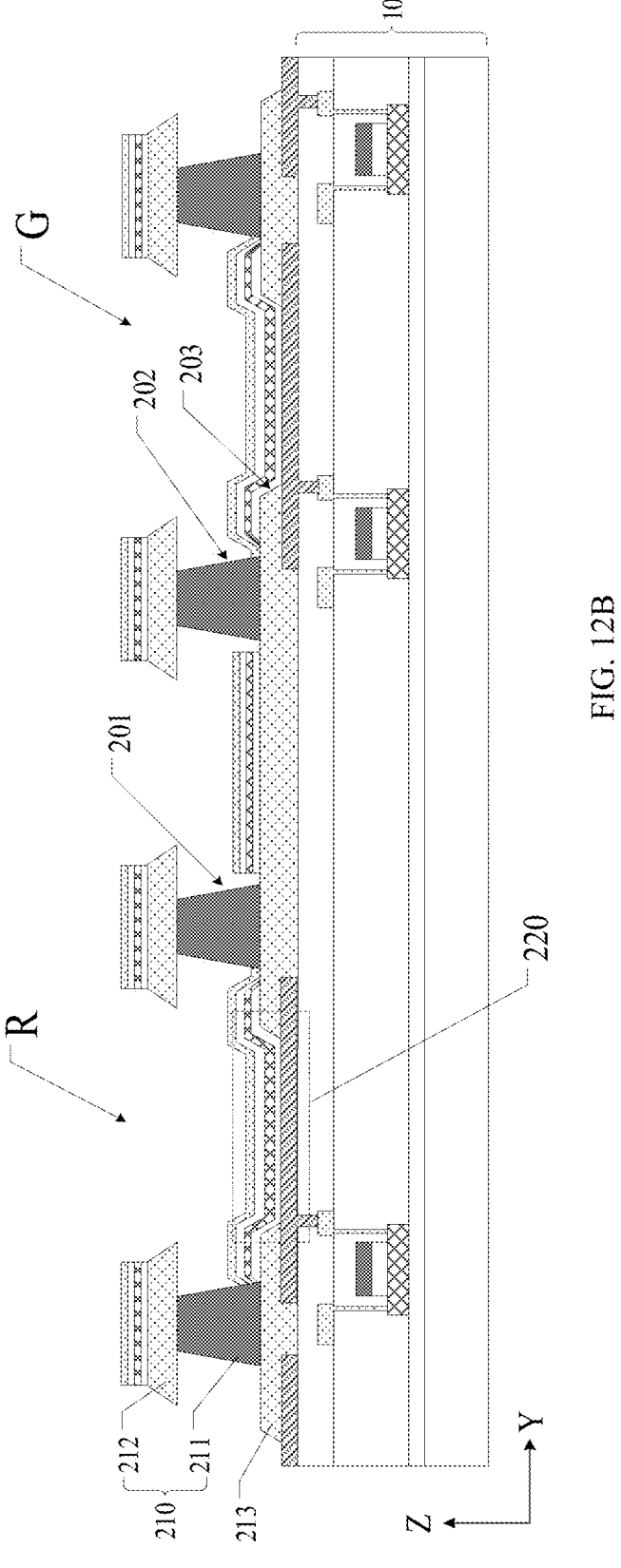

As shown in FIG. 12B, a light-emitting function layer and a second electrode are deposited on the substrate 100 to form a light-emitting device 220 in each isolation opening 202 of the isolation structure 210. The deposition is performed without using a mask, so the deposited material will also accumulate on the crown portion 212 and within the light-transmitting opening 201 and the isolation opening 202. For example, the light-emitting function layer deposited may be used to emit red light (R), that is, in this stage, the light-emitting devices 220 emitting red light are formed in each light-transmitting opening 201 and each isolation opening 202 of the isolation structure 210.

Figure 12C:
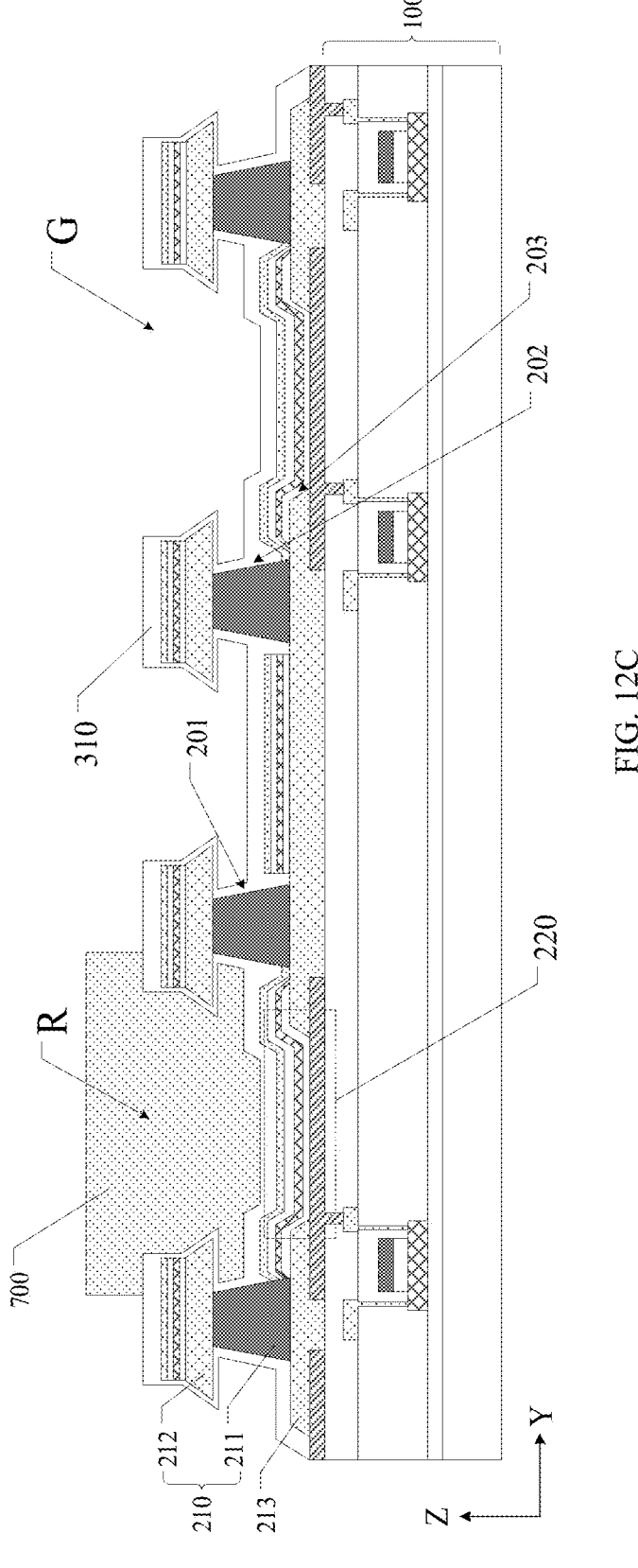

As shown in FIG. 12C, a first encapsulation layer 310 is deposited to cover the light-emitting device 220, and the first encapsulation layer 310 covers an entire display area in this stage. The photoresist is formed (for example, coated, and the like) on the first encapsulation layer 310, and then is patterned to form a photoresist pattern 700. The photoresist pattern 700 only covers a part of the isolation opening 202 of the isolation structure 210 (an isolation opening 202 where the light-emitting device R of a finished display panel is located).

Figure 12D:
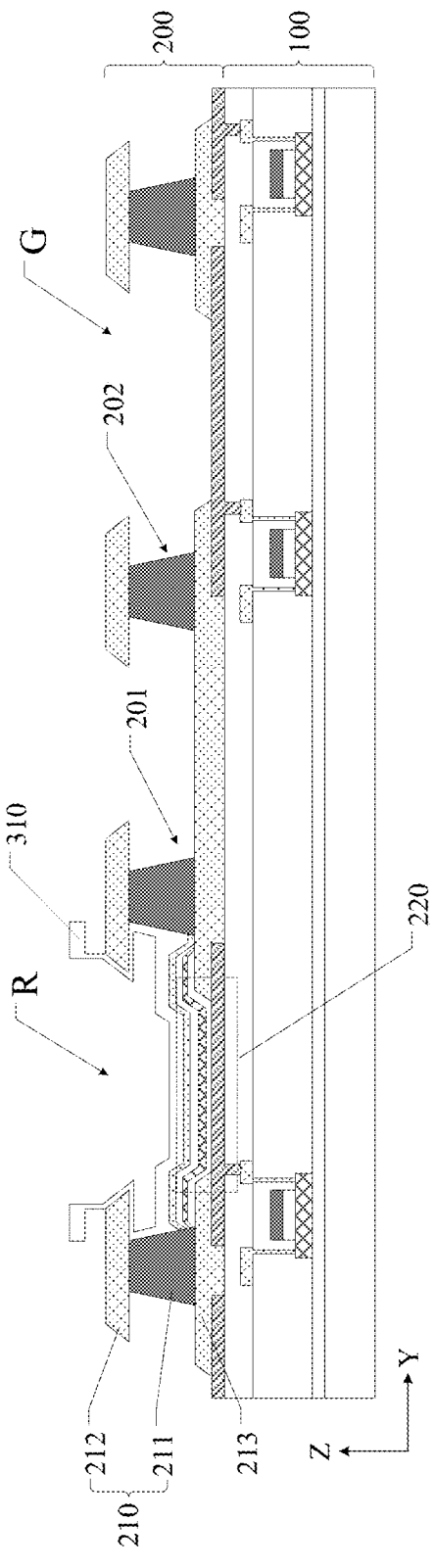

As shown in FIG. 12D, a surface of the display panel is etched by using the photoresist pattern 700 as a mask, and the first encapsulation layer 310, the second electrode and the light-emitting function layer that are not covered by the photoresist pattern 700 are removed. And then a residual photoresist pattern 700 is removed.

Figure 12E:
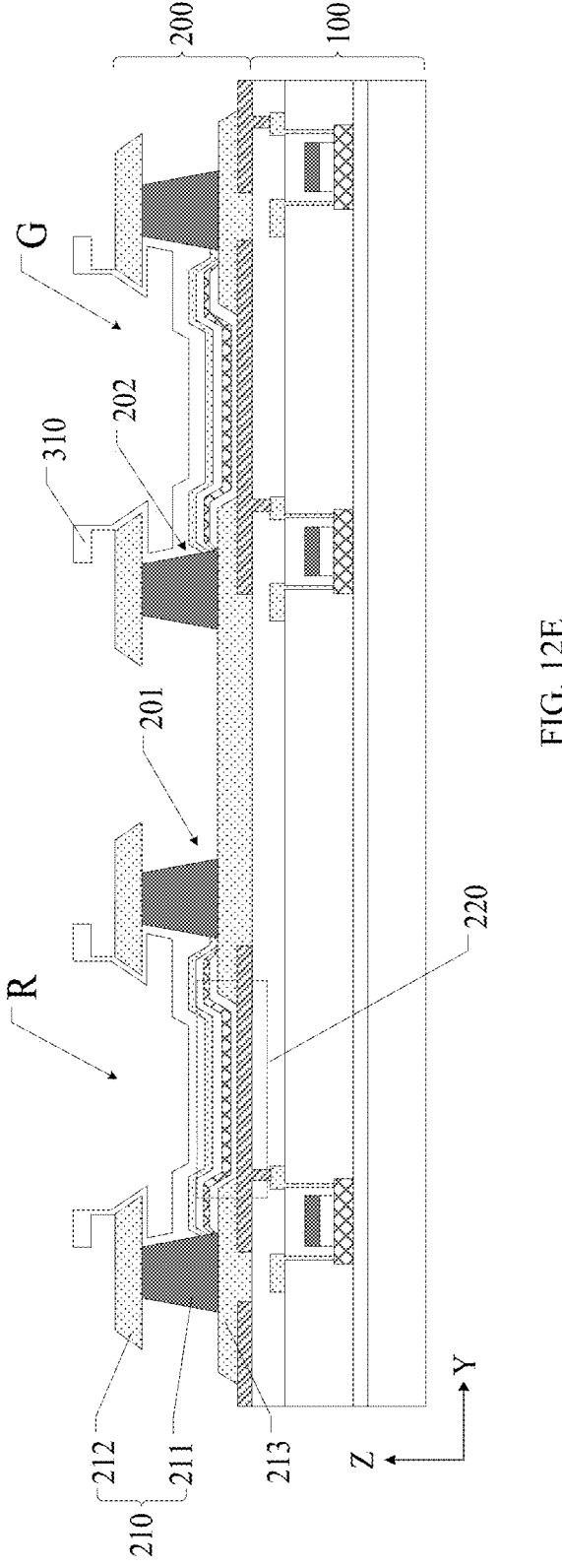

As shown in FIG. 12E, the above steps are repeated to form the light emitting devices 220 emitting green light and blue light respectively in other isolation openings 202.

As shown in FIG. 3, after all the light-emitting devices 220 are prepared, a second encapsulation layer 320 is formed on the first encapsulation layer 310, a through hole is formed in the second encapsulation layer 320, and a transparent electrode is formed on the second encapsulation layer 320 to serve as the light-transmitting shielding layer 30. The light-transmitting shielding layer 30 is in contact with the isolation structure 210 through the through hole, and then a third encapsulation layer 330 is formed on the second encapsulation layer 320.

Referring back to FIG. 3 and FIG. 4, a touch electrode layer 400 is prepared on the third encapsulation layer 330.

A preparation sequence of the light-emitting devices 220 emitting red light, green light and blue light may be designed based on an actual requirement, and the preparation sequence is not limited in the embodiments of the present disclosure.

In some embodiments of the present disclosure, some film layers in the light-emitting function layer, such as a light-emitting layer, may be prepared in a non-evaporation method, for example, inkjet printing, and the specific prepa-ration method of these film layers may be selected based on a material of the film layers. For example, in a case where the material of film layers are polymer materials and are not suitable for an evaporation method, inkjet printing may be used for preparation.

In the embodiments of the present disclosure, a design area of the first area is not limited, and may be designed based on requirements of an actual process and an applica-tion scenario of the display panel.

For example, in some embodiments of the present dis-closure, all of the display areas may be designed as the first area 13. In this design, the display panel may be used in scenarios such as transparent display.

For example, in some other embodiments of the present disclosure, referring back to FIG. 1, the display area further includes a second area (an area inside the display area 11 and outside the first area 13). The second area is located on at least one side of the first area 13. The first area 13 is a light-transmitting area, and the second area is a non-light-transmitting area. In this design, the display panel may be used in scenarios such as fingerprint recognition or under-screen camera.

At least one embodiment of the present disclosure pro-vides a display device. The display device may include the display panel in the foregoing embodiments. In addition, in a case that the first area is a recognition area, the display device may include a recognition device, and an ortho-graphic projection of the recognition device on the substrate at least partially overlaps with an orthographic projection of the first area on the substrate.

For example, in some embodiments of the present dis-closure, the recognition device may include at least one fingerprint recognition sensor. For example, the fingerprint recognition sensor may be disposed on a side, away from the display function layer, of the substrate. Alternatively, the fingerprint recognition sensor may be disposed in the sub-strate.

For example, in some other embodiments of the present disclosure, the recognition device may be a camera, and the camera is located on a side, away from the display function layer, of the substrate.

For example, in the embodiments of the present disclo-sure, the display device may be any product or component having a display function, such as a television, a digital camera, a mobile phone, a watch, a tablet computer, a notebook computer, and a navigator.

The above description is only some preferred embodiments of the present specification and is not intended to limit the present specification, and any modification, equivalent replacement, and the like, made within the spirit and principle of the present specification shall fall within the protection scope of the present specification.

What is claimed is:

1. A display panel, comprising:

a substrate;

a display function layer, comprising a plurality of light-emitting devices and a plurality of light-transmitting openings arranged on the substrate, wherein the light-transmitting opening is located at an interstice between adjacent two of the plurality of light-emitting devices;

a touch structure, located on a side, away from the substrate, of the display function layer, and comprising a touch electrode; and a light-transmitting shielding layer, located on a side, close to the display function layer, of the touch structure, wherein an orthographic projection of the light-transmitting openings on the substrate is within an orthographic projection of the light-transmitting shielding layer on the substrate.

2. The display panel according to claim 1, wherein the interstice between adjacent two of the plurality of light-emitting devices is a first interstice, an interstice between a light-emitting device and a light-transmitting opening adjacent to the light-emitting device is a second interstice, and the touch electrode is a grid-like electrode, and orthographic projections of a plurality of grid lines of the grid-like electrode on the substrate are within an orthographic projection of the first interstice and an orthographic projection of the second interstice on the substrate.

3. The display panel according to claim 1, wherein a material of the light-transmitting shielding layer comprises a transparent conductive material.

4. The display panel according to claim 1, wherein a material of the light-transmitting shielding layer comprises at least one of indium tin oxide, indium gallium oxide, and indium zinc oxide.

5. The display panel according to claim 1, wherein the substrate comprises a driving circuit layer.

6. The display panel according to claim 1, further comprising:

an isolation structure, located on the substrate and configured to define the plurality of light-transmitting openings and a plurality of isolation openings, wherein the plurality of light-emitting devices are respectively limited in the plurality of isolation openings.

7. The display panel according to claim 6, wherein the light-emitting device comprises a first electrode, a light-emitting function layer, and a second electrode sequentially stacked on the substrate, and the light-emitting function layer and the second electrode of the light-emitting device are located in an isolation opening corresponding to the light-emitting device, the isolation structure comprises a support portion and a crown portion sequentially stacked on the substrate, and an orthographic projection of the support portion on the substrate is within an orthographic projection of the crown on the substrate, and the support portion is a conductive structure, and the second electrode of the light-emitting device is connected to the support portion.

8. The display panel according to claim 7, wherein the display function layer further comprises:

a pixel defining layer, located on a side, close to the isolation structure, of the substrate, and comprising a plurality of pixel openings respectively corresponding to the plurality of isolation openings, wherein the pixel opening is configured to limit the light-emitting device and expose the first electrode, and the pixel opening is connected to the corresponding isolation opening.

9. The display panel according to claim 8, wherein the light-transmitting shielding layer is located on a side, close to the touch structure, of the pixel defining layer, and is connected to the support portion.

10. The display panel according to claim 7, wherein the light-transmitting shielding layer is located on a side, close to the crown portion, of the support portion, and is connected to the support portion.

11. The display panel according to claim 10, wherein an orthographic projection of the light-transmitting shielding layer on the substrate overlaps with an orthographic projection of the support portion on the substrate.

12. The display panel according to claim 10, wherein the light-transmitting shielding layer comprises a plurality of shielding units, and a shielding unit is located in the light-transmitting opening and covers at least a part of a side wall of the support portion.

13. The display panel according to claim 7, wherein the light-transmitting shielding layer covers the display function layer and the plurality of light-transmitting openings, and the light-transmitting shielding layer is located on a side, away from the substrate, of the isolation structure and in contact with a surface, away from the substrate, of the isolation structure, and the crown portion is a conductive structure.

14. The display panel according to claim 7, further comprising a first encapsulation layer, a second encapsulation layer and a third encapsulation layer sequentially stacked on the display function layer, wherein the touch structure is located on a side, away from the substrate, of the third encapsulation layer, the first encapsulation layer and the third encapsulation layer are inorganic layers, and the second encapsulation layer is an organic layer, and the light-transmitting shielding layer covers the display function layer and the plurality of light-transmitting openings, the light-transmitting shielding layer is located on a side, close to the second encapsulation layer, of the first encapsulation layer, the light-transmitting shielding layer is in contact with the isolation structure, and the isolation structure is a conductive structure.

15. The display panel according to claim 7, further comprising a first encapsulation layer, a second encapsulation layer and a third encapsulation layer sequentially stacked on the display function layer, wherein the touch structure is located on a side, away from the substrate, of the third encapsulation layer, the first encapsulation layer and the third encapsulation layer are inorganic layers, and the second encapsulation layer is an organic layer, and the light-transmitting shielding layer covers the display function layer and the plurality of light-transmitting openings, the light-transmitting shielding layer is located on a side, close to the third encapsulation layer, of the second encapsulation layer, the second encapsulation layer is provided with a through hole, the light-transmitting shielding layer is connected to the isolation structure through the through hole, and the isolation structure is a conductive structure.

16. The display panel according to claim 6, wherein the display panel comprises a display area, the light-transmitting shielding layer and the isolation structure are located in the display area, and a through hole is located in the display area.

17. The display panel according to claim 6, wherein the display panel comprises a display area and a non-display area located on at least one side of the display area, the light-transmitting shielding layer and the isolation structure extend from the display area to the non-display area, and a through hole is located in the non-display area.

18. The display panel according to claim 6, further comprising a first encapsulation layer, a second encapsulation layer, a third encapsulation layer and a buffer layer sequentially stacked on the display function layer, wherein the touch structure is located on a side, away from the substrate, of the buffer layer, the first encapsulation layer, the third encapsulation layer and the buffer layer are inorganic layers, the second encapsulation layer is an organic layer, and the light-transmitting shielding layer covers the display function layer and the plurality of light-transmitting openings, the light-transmitting shielding layer is located on a side, close to the touch structure, of the buffer layer, through holes are respectively provided in the second encapsulation layer and the buffer layer, the light-transmitting shielding layer is connected to the isolation structure through the through holes, and the isolation structure is a conductive structure.

19. The display panel according to claim 1, wherein the display panel comprises a display area, the display area comprises a first area and a second area, the second area is located on at least one side of the first area, and the plurality of light-transmitting openings are located in the first area.

20. A display device, comprising the display panel according to claim 1.

* * * * *